United States Patent
Chockalingam et al.

(10) Patent No.: US 10,892,239 B1
(45) Date of Patent: Jan. 12, 2021

(54) BOND PAD RELIABILITY OF SEMICONDUCTOR DEVICES

(71) Applicant: GLOBALFOUNDRIES Singapore Pte. Ltd., Singapore (SG)

(72) Inventors: Ramasamy Chockalingam, Singapore (SG); Juan Boon Tan, Singapore (SG); Ian Melville, Highland, NY (US)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/508,288

(22) Filed: Jul. 10, 2019

(51) Int. Cl.
*H01L 23/34* (2006.01)
*H01L 23/00* (2006.01)

(52) U.S. Cl.
CPC .............. *H01L 24/05* (2013.01); *H01L 24/03* (2013.01); *H01L 24/45* (2013.01); *H01L 24/85* (2013.01); *H01L 2224/0221* (2013.01); *H01L 2224/02206* (2013.01); *H01L 2224/02215* (2013.01); *H01L 2224/03019* (2013.01); *H01L 2224/03452* (2013.01); *H01L 2224/03614* (2013.01); *H01L 2224/04042* (2013.01); *H01L 2224/05147* (2013.01); *H01L 2224/45147* (2013.01); *H01L 2224/83007* (2013.01); *H01L 2224/83205* (2013.01); *H01L 2924/0509* (2013.01); *H01L 2924/05042* (2013.01); *H01L 2924/05442* (2013.01); *H01L 2924/35121* (2013.01)

(58) Field of Classification Search
CPC ......... H01L 23/48; H01L 24/05; H01L 24/81; H01L 24/03; H01L 24/06; H01L 24/32; H01L 24/17; H01L 24/83; H01L 24/85; H01L 24/14; H01L 24/45
USPC ........................................................ 257/773
See application file for complete search history.

(56) References Cited

U.S. PATENT DOCUMENTS

| 5,294,295 | A | 3/1994 | Gabriel | |
|---|---|---|---|---|
| 6,218,732 | B1 | 4/2001 | Russell et al. | |
| 6,306,749 | B1 | 10/2001 | Lin | |
| 2013/0087908 | A1* | 4/2013 | Yu | H01L 24/13 257/737 |
| 2013/0093104 | A1* | 4/2013 | Wu | H01L 23/291 257/782 |
| 2014/0021633 | A1* | 1/2014 | Lee | H01L 23/481 257/774 |
| 2015/0206823 | A1* | 7/2015 | Lin | H01L 21/76898 257/774 |

* cited by examiner

*Primary Examiner* — Theresa T Doan
(74) *Attorney, Agent, or Firm* — David Cain

(57) ABSTRACT

The disclosed subject matter relates to a structure and method to improve bond pad reliability of semiconductor devices. According to an aspect of the present disclosure, a bond pad structure is provided that includes a dielectric layer and at least one bond pad in the dielectric layer, wherein the bond pad has a top surface. A passivation layer has an opening over the bond pad, wherein the opening has sidewalls. A low-k barrier layer is covering the sidewalls of the opening and the top surface of the bond pad. Protective structures are formed over the sidewalls of the opening.

20 Claims, 9 Drawing Sheets

BOND PAD RELIABILITY OF SEMICONDUCTOR DEVICES

FIELD OF THE INVENTION

The presently disclosed subject matter relates generally to a structure and method to improve bond pad reliability of semiconductor devices. More specifically, the disclosed subject matter relates to a structure and method to improve the bond pad structure integrity and prevent contamination from entering the bond pad structure.

BACKGROUND

During the formation of integrated circuit (IC) packaging processes, a semiconductor device can be connected to the outside device or substrate via a wire-bonding process. In such a process, one or more bonding pads are provided which are in contact with respective parts of the semiconductor device at the outermost conductive layer. Bond pads are typically made from a conductive material, such as aluminum (Al) or copper (Cu). Then, a bonding wire such as copper (Cu) or gold (Au) is bonded onto the bond pad so as to allow the semiconductor device to make electrical contact with the inner lead of the IC package.

A semiconductor device surface is typically protected by a passivation layer. The passivation layer prevents contamination and moisture from entering the device and affecting its reliability and operation. The passivation layer on the outermost conductive layer may have openings over the bond pads for wire bonds to be subsequently connected.

One of the challenges in bond pad structure reliability is failure due to delamination of the bond pad after the wire bonding process. During the wire bonding process, cracks may be introduced in the passivation sidewalls. Moisture or contamination introduced during the IC packaging process may enter through the cracks in passivation sidewalls resulting in delamination of the bond pad.

Hence, there is an urgent need to overcome the issue stated above.

SUMMARY

As described above, there are several challenges in preventing contamination and moisture from entering the bond pad structures. It is therefore desirable to provide a method to improve the integrity of the bond pad structures of semiconductor devices.

To achieve the foregoing and other aspects of the present disclosure, a structure and method to improve the bond pad structure reliability is presented.

According to an aspect of the present disclosure, a bond pad structure is provided that includes a dielectric layer and at least one bond pad in the dielectric layer, wherein the bond pad has a top surface. A passivation layer has an opening over the bond pad, wherein the opening has sidewalls. A low-k barrier layer covers the sidewalls of the opening and the top surface of the bond pad. Protective structures cover the low-k barrier layer over the sidewalls of the opening.

According to another aspect of the present disclosure, a bond pad structure is provided that includes a dielectric layer and at least one copper bond pad in the dielectric layer, wherein the bond pad has a top surface. A passivation layer has an opening over the bond pad, wherein the opening has sidewalls. A low-k barrier layer covers the sidewalls of the opening and the top surface of the bond pad. Protective laminate structures cover the low-k barrier layer over the sidewalls of the opening.

According to yet another aspect of the present disclosure, a method of fabricating a bond pad structure is provided. The method comprise providing a dielectric layer and forming at least one copper bond pad in the dielectric layer, wherein the bond pad has a top surface. A passivation layer is deposited over the bond pad and over the dielectric layer. An opening in the passivation layer is formed to expose the bond pad, wherein the opening has sidewalls. A low-k barrier layer is deposited over the sidewalls of the opening and over the top surface of the bond pad. A protective layer is deposited covering the low-k barrier layer over the sidewalls of the opening and over the top surface of the bond pad. The protective layer is etched to form protective structures covering the low-k barrier layer over the sidewalls of the opening.

BRIEF DESCRIPTION OF THE DRAWINGS

The embodiments of the present disclosure will be better understood from a reading of the following detailed description, taken in conjunction with the accompanying drawings.

Figure 1A:
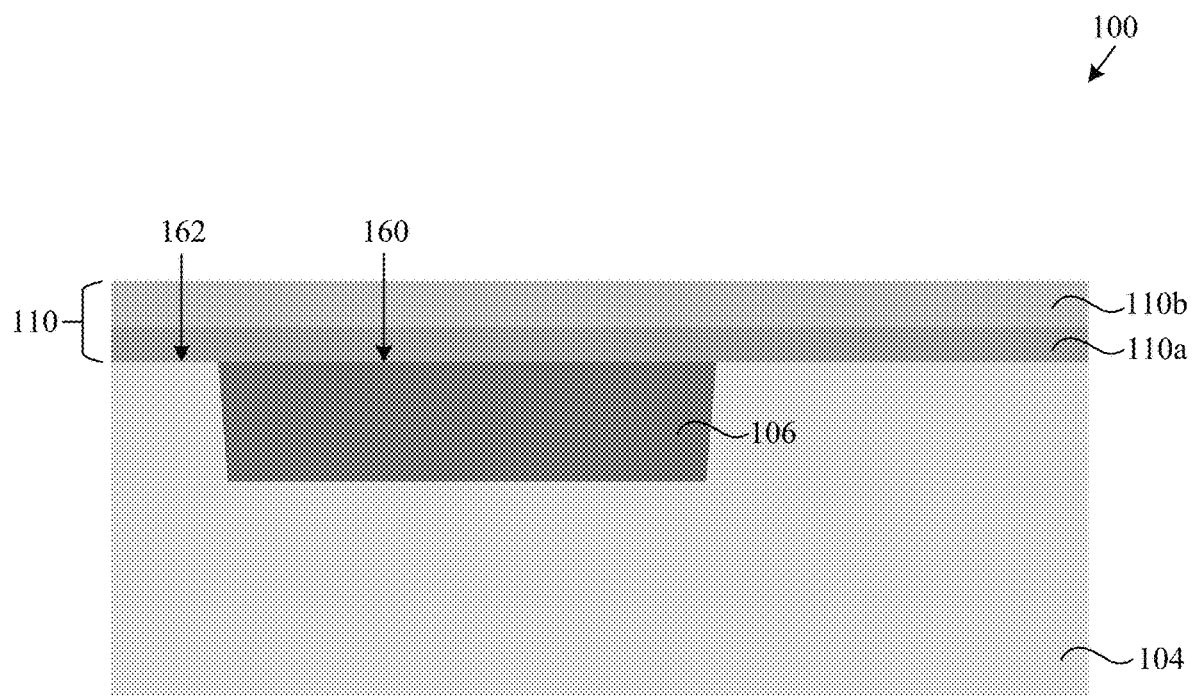
FIGS. 1A-1G are cross-sectional views of a semiconductor device depicting the process steps in a method of improving bond pad reliability, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the device. Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

The following detailed description is exemplary in nature and is not intended to limit the device or the application and uses of the device. Furthermore, there is no intention to be bound by any theory presented in the preceding background of the device or the following detailed description.

The present disclosure relates to a structure and method of improving bond pad reliability by preventing cracks from forming in the passivation sidewalls and contamination and moisture from entering the bond pad structure. In particular, a layer of low-k barrier material is used to cover the sidewalls of the bond pad opening and the top surface of the bond pad and protective structures are formed over the low-k barrier layer covering the sidewalls of the opening. Aspects of the present disclosure are now described in detail with accompanying figures. It is noted that like and corresponding elements are referred to by like reference numerals.

Referring to FIG. 1A, the semiconductor device 100 includes a dielectric layer 104, at least one bond pad 106 formed in the dielectric layer 104, and a passivation layer 110 deposited over the bond pad 106 and the dielectric layer 104. The formation of the bond pad 106 in the dielectric layer 104 includes etching an opening in the dielectric layer 104. A conductive material, such as copper (Cu) or Aluminum (Al), is deposited over the dielectric layer 104, filling up the opening. In an embodiment of the disclosure, the conductive material is Cu. A planarization process such as chemical mechanical polishing (CMP) is used to remove the conductive material outside the opening. The bond pad 106 has an upper surface 160 that is coplanar with an upper surface 162 of the dielectric layer 104. Although not shown, the bond pad 106 is connected to devices formed on an active region underneath the dielectric layer 104.

The dielectric layer 104 is made from a dielectric material having an ultra-low dielectric constant. The passivation layer 110 may be made of a layer of silicon carbon nitride (SiCN) 110a and tetraethyl orthosilicate (TEOS) 110b. The thickness of the SiCN layer 110a ranges between 1000 to 5000 Å. In addition, the thickness of the TEOS layer 110b ranges between 7000 to 15000 Å. The passivation layer 110 may be deposited by chemical vapor deposition (CVD), physical vapor deposition (PVD), atomic layer deposition (ALD), or any other suitable process.

Figure 1B:
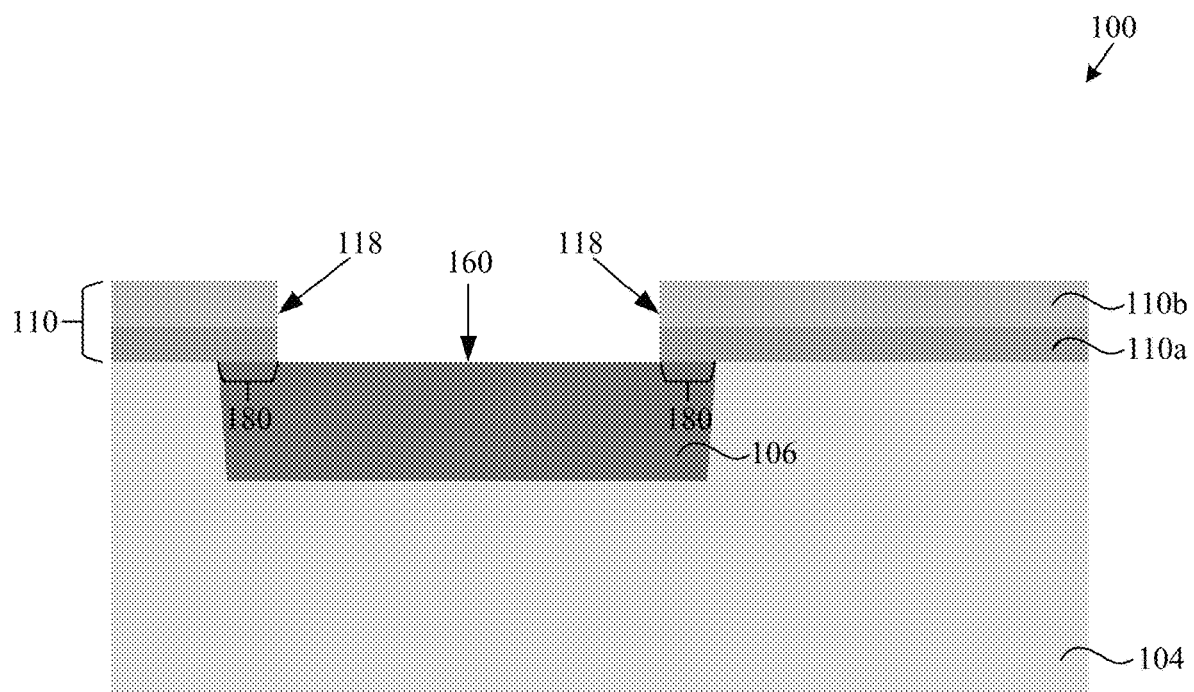

Referring to FIG. 1B, an opening is formed in the passivation layer 110, i.e., a portion of the passivation layer 110 covering the bond pad 106 is removed, to expose the bond pad 106. The opening has sidewalls 118. The opening is formed by conventional lithography and plasma etching processes and may have a same width or smaller width as the bond pad 106. A portion of the passivation layer 110 overlaps with the bond pad 106. The overlap regions 180 provide protection from bond pad 106 delamination.

Figure 1C:
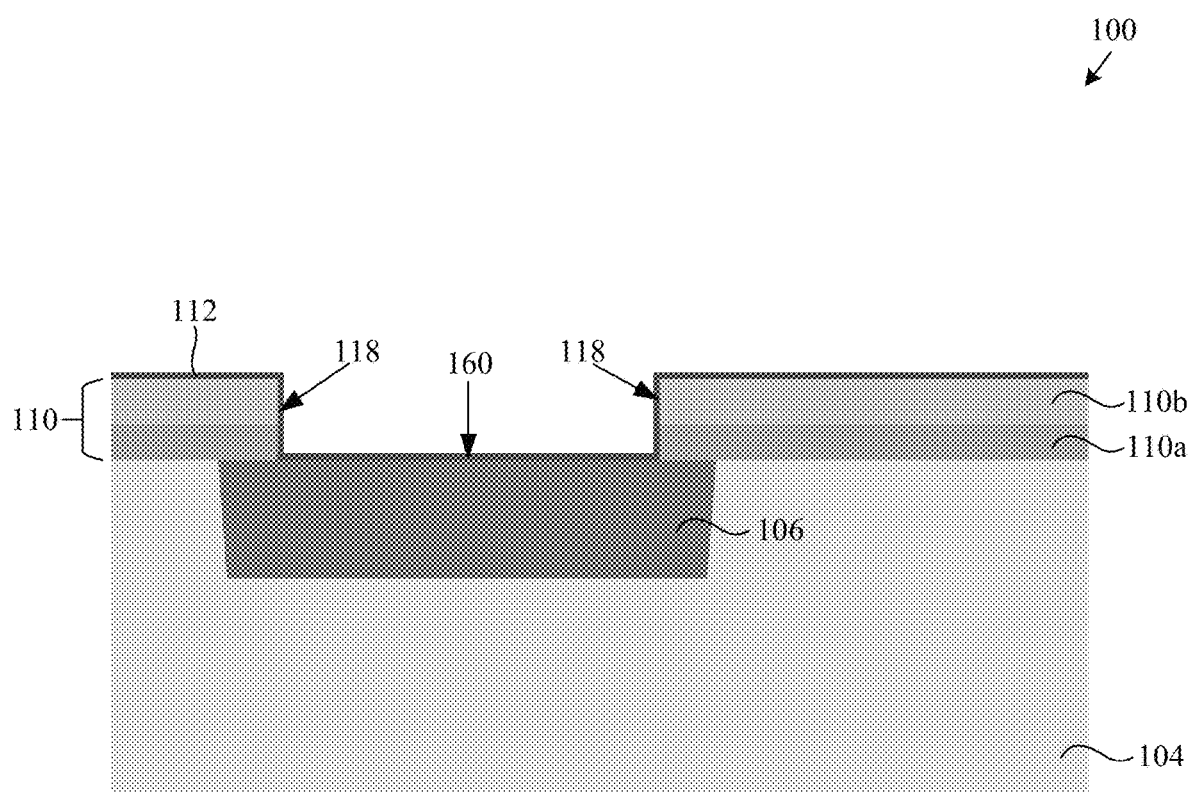

Referring to FIG. 1C, a layer of low-k barrier material 112 is deposited conformally over the sidewalls 118 of the opening and over the top surface 160 of the bond pad 106. The low-k barrier layer 112 is also deposited over the passivation layer 110. In an embodiment of the disclosure, the low-k barrier layer 112 is made of SiCN. In another embodiment, the low-k barrier material is made of silicon oxynitride (SiON) or silicon nitride ($Si_xN_y$), wherein x and y are in stoichiometric ratio. The SiCN layer 112 has a preferred thickness in a range of 50 Å to 200 Å. In a preferred embodiment of the disclosure, the SiCN layer 112 has a preferred thickness of 75 Å. The SiCN layer protects the bond pad surface from corrosion or oxidation during semiconductor device fabrication, thereby increasing the storage life of the semiconductor device.

Figure 1D:
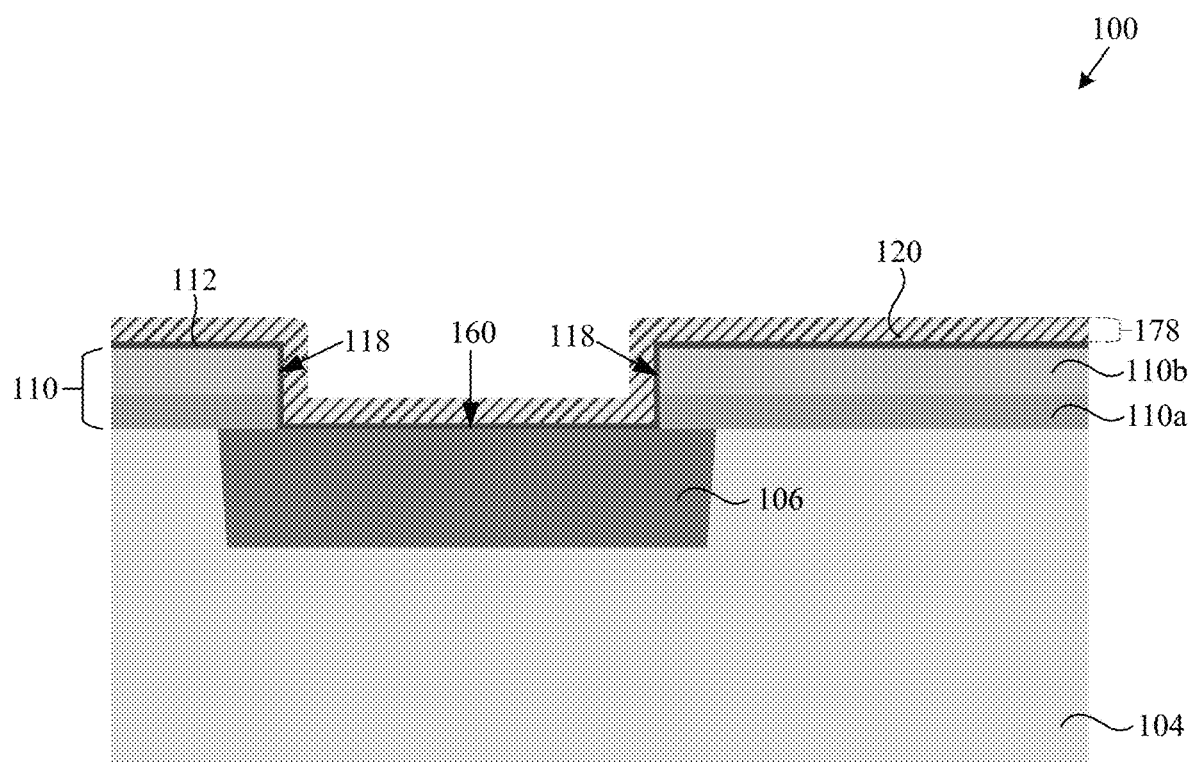

Referring to FIG. 1D, a protective layer 120 is conformally deposited over the SiCN layer 112, covering the sidewalls 118 of the opening and over the top surface 160 of the bond pad 106. The protective layer 120 is also deposited over the passivation layer 110. In an embodiment of the disclosure, the protective layer 120 is a $SiO_2$ layer with a thickness range between 2000 to 5000 Å. In a preferred embodiment, the thickness 178 of the protective layer 120 is approximately 2000 Å.

The protective layer 120 may be deposited by CVD, PVD, ALD or any other suitable material deposition processes. For example, the protective layer 120 may be formed by depositing TEOS using a CVD process, thereby forming a layer of $SiO_2$.

Figure 1E:
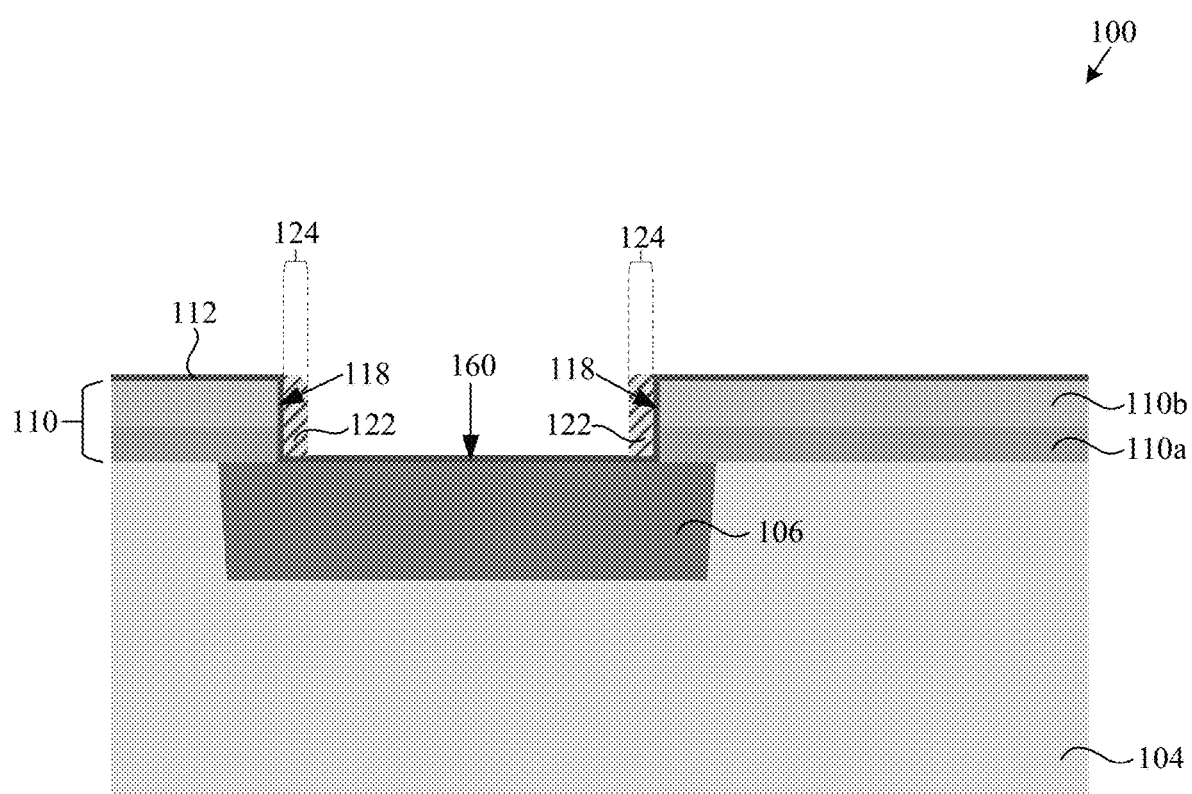

Referring to FIG. 1E, protective structures 122 are formed over the sidewalls 118 of the opening by anisotropic etching of the protective layer 120. The etching process is selective to the underlying SiCN layer 112. The SiCN layer 112 remains to protect the bond pad 106 surface from the chemicals used in the etching process for the formation of the protective structures 122. The protective layer 120 is shown completely removed from the surface of the passivation layer 110 after the formation of the protective structures 122, but need not be completely removed. The protective structures 122 have a thickness 124 in the range of 2000 to 5000 Å. The preferred thickness 124 of the protective structures 122 is approximately 2000 Å.

In an embodiment of the disclosure, the anisotropic etching process may be a reactive ion etching process. The term "anisotropic etching" refers to etching which does not proceed in all directions at the same rate. If etching proceeds exclusively in one direction (e.g. only vertically), the etching process is said to be completely anisotropic.

The term "selective etching" as used here means a chemical attack method which can selectively eliminate the upper layer of $SiO_2$ or protective material 120 without attacking the next layer of SiCN, termed the stop layer for this reason, by adjusting the composition of the chemical solution and, as a result, adjusting the etching rates between the $SiO_2$ and the SiCN.

Figure 1F:
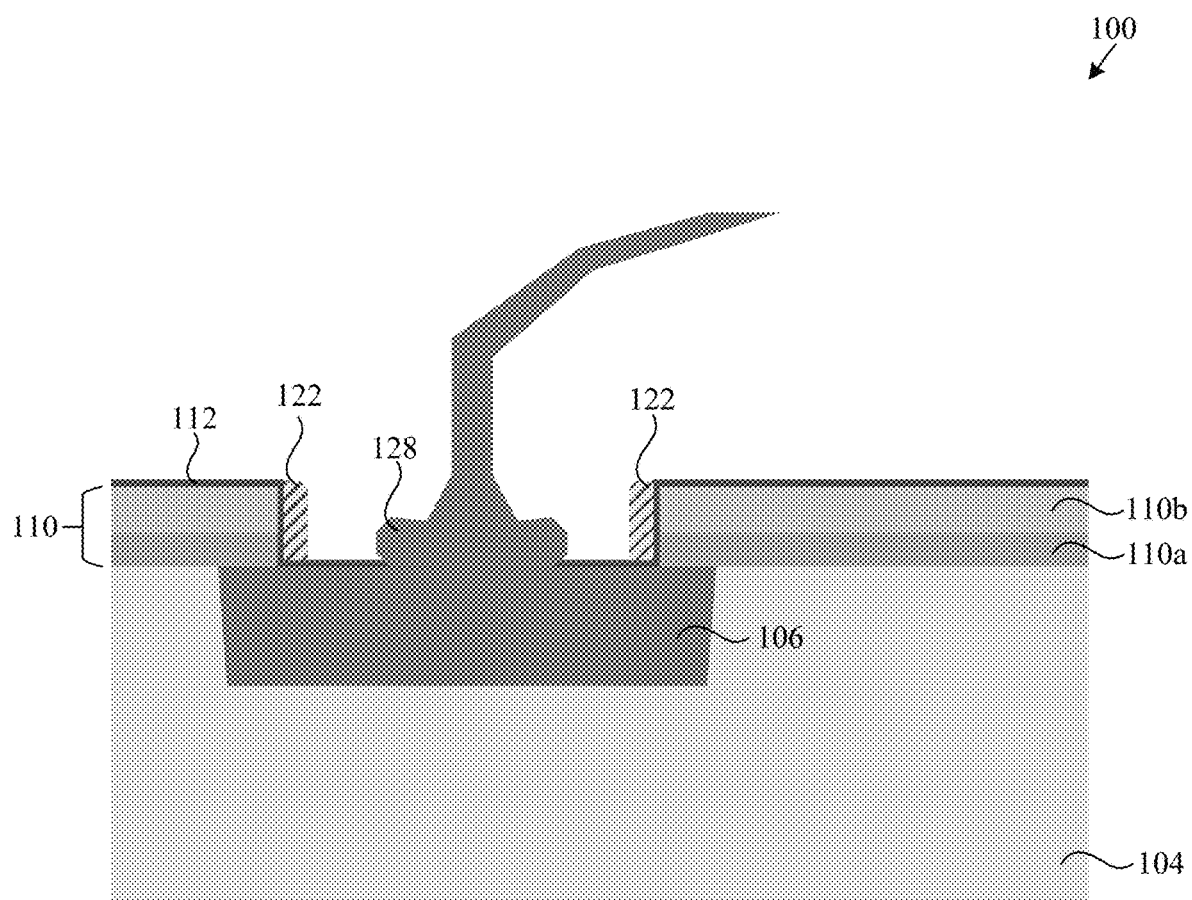

Referring to FIG. 1F, a wire 128 is bonded to the bond pad 106 by ultrasonic bonding and the SiCN layer 112 over the bond pad 106 surface at the interface "migrates" away during the bonding. In ultrasonic bonding process, the sidewalls 118 of the opening are protected by the SiCN layer 112 and the protective structures 122. Hence, the sidewalls 118 of the opening are well protected from mechanical damage should any misalignment occur during the wire bonding process.

As used herein, the term "ultrasonic bonding" includes a solid state process in which the wire 128 is bonded to the bond pad 106 and the SiCN layer 112 over the bond pad 106 surface by locally applying high-frequency vibratory energy thereto while the surfaces are held together under bias pressure. The wire 128 is preferably made of copper.

Figure 1G:
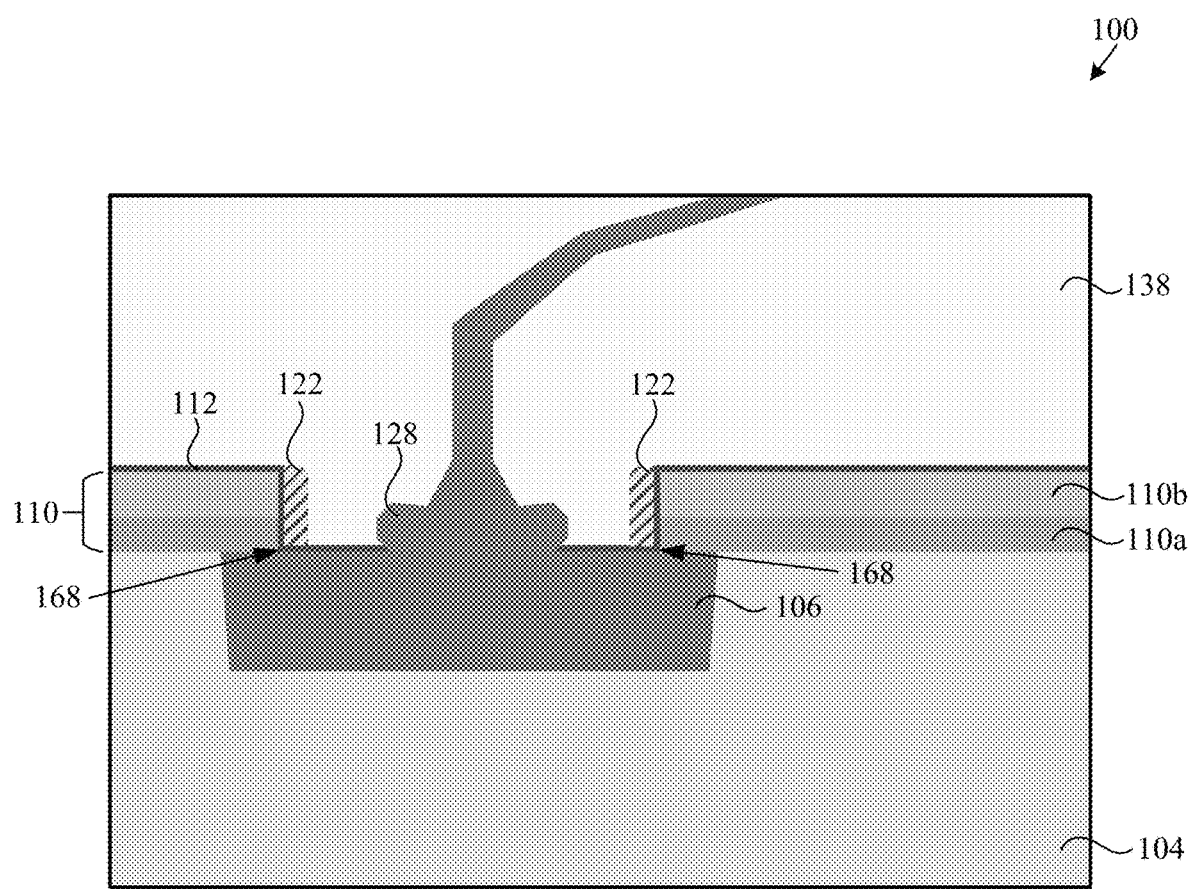

Referring to FIG. 1G, a molding compound 138 is deposited over the semiconductor device 100, covering the SiCN layer 112, protective structures 122 and the wire bond 128. The molding compound 138 is a plastic, viscous liquid. Temperature treatment may be used to harden the molding compound 138. The SiCN layer 112 and the protective structures 122 on the sidewalls 118 of the opening prevent any cracks or mechanical damage from occurring, especially at the interface 168 between the passivation layer 110 and the bond pad 106 surface. This avoids the occurrence of the molding compound 138 seeping in through cracks on the sidewalls 118 of the opening.

Figure 2:
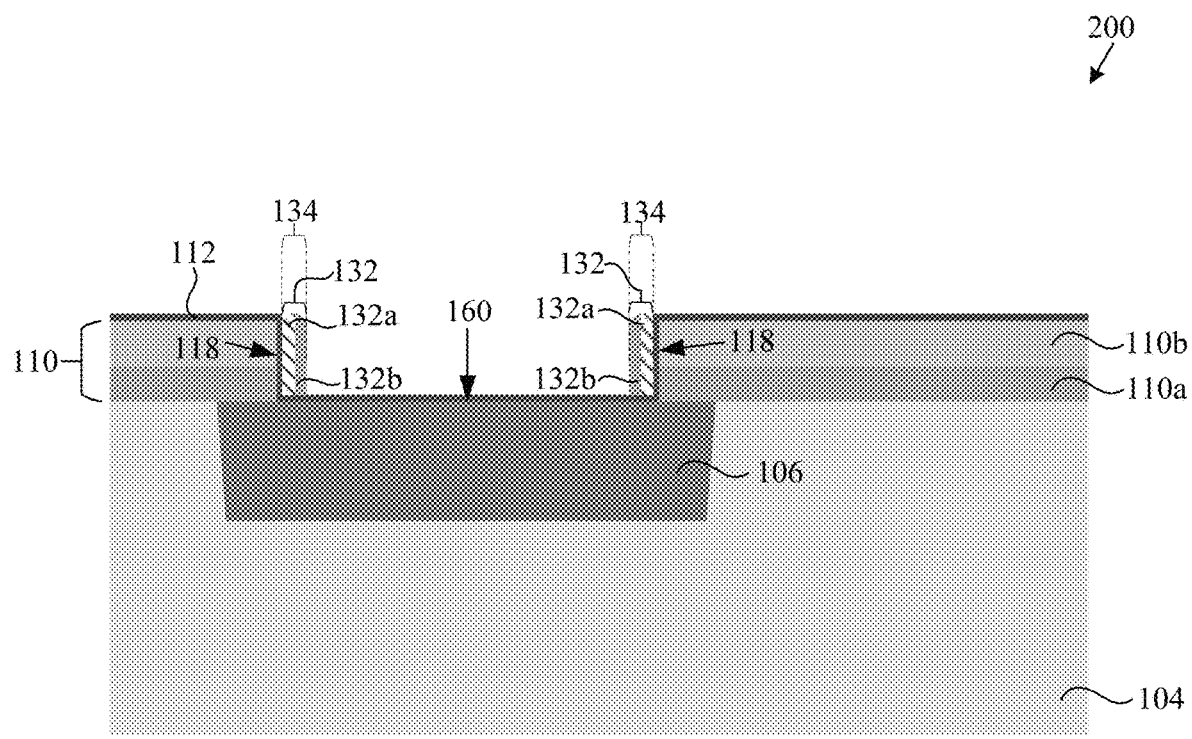
FIG. 2 is a cross-sectional view of a semiconductor device according to another embodiment of the disclosure.

The present method, as described above with regard to FIGS. 1A through 1G, may be modified to create alternative embodiments of the device within the scope of this disclosure. For example, FIG. 2 is a cross-sectional view of a semiconductor device 200, according to another embodiment of the disclosure, having a bond pad 106 is formed in a dielectric layer 104, wherein the bond pad 106 has a top surface 160. A passivation layer 110 is deposited on the surface of the bond pad 106 and the dielectric layer 104. An opening is formed in the passivation layer 110, the opening having sidewalls 118. A layer of SiCN material 112 is deposited on the sidewalls 118 of the opening and on the top surface 160 of the bond pad 106. Protective structures 132 are formed covering the sidewalls 118 of the opening, wherein the protective structures 132 are laminates. The laminates may include a layer of silicon dioxide 132a and a layer of silicon nitride 132b. The layer of silicon nitride 132b provides an additional protection to the sidewalls of 118 of the opening as silicon nitride is a good moisture barrier.

The protective structures 132 have a thickness 134 in the range of 2000 to 5000 Å. The preferred thickness 134 of the protective structures 132 is approximately 2000 Å. In an embodiment of the disclosure, the silicon dioxide layer 132a may have a thickness of approximately 500 Å, while the silicon nitride layer 132b may have a thickness of approximately 1500 Å. In another embodiment of the disclosure, the silicon dioxide layer 132a may have a thickness of approximately 1000 Å, while the silicon nitride layer 132b may have a thickness of approximately 1000 Å.

The formation of the protective structures 132 may include deposition of a silicon dioxide layer over the SiCN layer 112 covering the sidewalls 118 of the opening and the top surface 160 of the bond pad 106. A layer of silicon nitride is subsequently deposited over the silicon dioxide layer. The deposition of both the silicon dioxide layer and the silicon nitride layer may be by CVD, ALD, PVD or any other suitable material deposition processes. The deposited silicon nitride layer is etched by an anisotropic etching process to form the silicon nitride layer 132b. The etching of the deposited silicon nitride layer stops when the silicon nitride layer over the top surface 160 of the bond pad 106 is removed, exposing the silicon dioxide layer. Hence, the etching process for the silicon nitride layer is selective to silicon dioxide. The deposited silicon dioxide layer is subsequently etched by an anisotropic etching process to form the silicon dioxide layer 132a. The etching process for the silicon dioxide layer is selective to the SiCN layer 112.

Figure 3A:
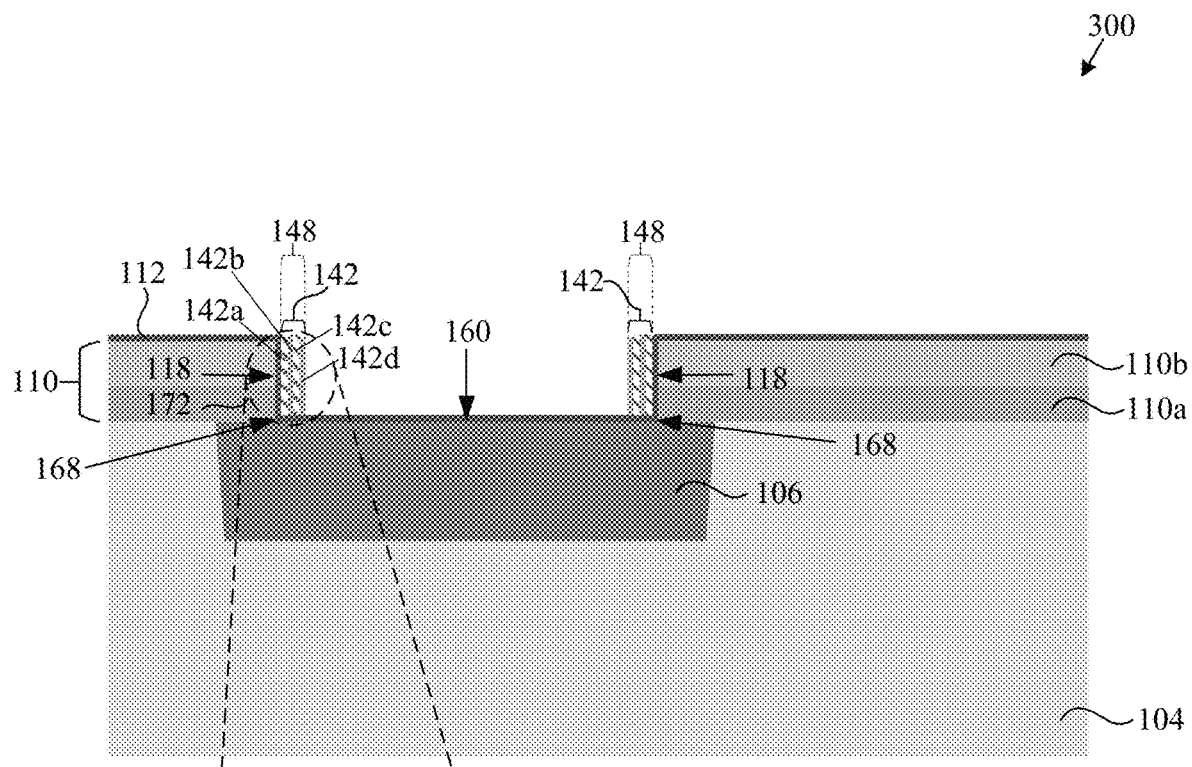
FIGS. 3A and 3B are cross-sectional views of a semiconductor device, according to yet another embodiment of the disclosure.
Figure 3B:
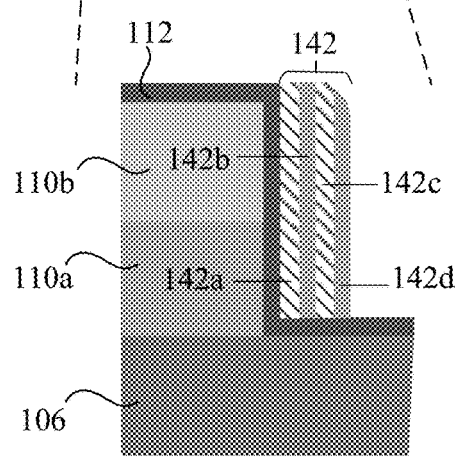

FIG. 3A is a cross-sectional view of a semiconductor device 300 according to yet another embodiment of the disclosure, while FIG. 3B is an enlarged view of part of the semiconductor device 300 encircled by the dashed line 172. Referring to FIG. 3A, a layer of SiCN material 112 is deposited on the sidewalls 118 of a passivation layer 110 opening and over the top surface 160 of a bond pad 106. Protective "laminate" structures 142 are formed over the SiCN layer 112 covering the sidewalls 118 of the opening. The protective structures 142 may include a first layer of silicon dioxide 142a, a first layer of silicon nitride 142b, a second layer of silicon dioxide 142c and a second layer silicon nitride 142d. As used herein, a laminate may comprise two or more layers that can be used to form the protective structures.

The protective structures 142 have a thickness 148 in the range of 2000 to 5000 Å. The preferred thickness 148 of the protective structures 142 is approximately 2000 Å. For example, the first layer of silicon dioxide 142a may have a thickness of approximately 500 Å and the first layer of silicon nitride 142b may have a thickness of approximately 500 Å. The second layer of silicon dioxide 142c may have a thickness of approximately 500 Å while the second layer of silicon nitride 142d may have a thickness of approximately 500 Å.

The formation of the protective structures 142 may include depositing a first layer of silicon dioxide over the SiCN layer 112 covering the sidewalls 118 of the opening and the top surface 160 of the bond pad 106. A first layer of silicon nitride is subsequently deposited over the first layer of silicon dioxide. A second layer of silicon dioxide is deposited over the layer of silicon nitride. A second layer of silicon nitride is deposited over the second layer of silicon dioxide, thereby completing the deposition processes.

The formation of the protective structures 142 further includes a series of etching process steps after the deposition processes are completed. A first anisotropic etching process etches the second layer of silicon nitride to form the second layer of silicon nitride 142d. The etching process is selective to the underlying second layer of silicon dioxide. A second anisotropic etching process etches the second layer of silicon dioxide to form the second layer of silicon dioxide 142c. The second anisotropic etching process is selective to the underlying first layer of silicon nitride. A third anisotropic etching process etches the first layer of silicon nitride to form the first layer of silicon nitride 142b. The etching process is selective to the underlying first layer of silicon dioxide. Hence, the first layer of silicon dioxide remains to protect the underlying SiCN layer 112. A fourth anisotropic etching process step etches the first layer of silicon dioxide to form the first layer of silicon dioxide 142a. The etching process is selective to the underlying SiCN layer 112. Hence, the SiCN layer 112 remains to protect the bond pad 106 surface.

Referring to FIGS. 3A and 3B, in yet another embodiment of the disclosure, the protective structures 142 may include a first layer of silicon nitride 142a, a first layer of silicon dioxide 142b, a second layer of silicon nitride 142c and a second layer of silicon dioxide 142d.

The formation of the protective structures 142 may include depositing a first layer of silicon nitride over the SiCN layer 112 covering the sidewalls 118 and top surface 160 of the bond pad 106. A first layer of silicon dioxide is subsequently deposited over the first layer of silicon nitride. A second layer of silicon nitride is deposited over the first layer of silicon dioxide. A second layer of silicon dioxide is deposited over the second layer of silicon nitride, thereby completing the deposition processes.

The formation of the protective structures 142 further includes etching processes after the completion of the deposition processes. A first anisotropic etching process etches the second layer of silicon dioxide to form the second layer of silicon dioxide 142d. The etching process is selective to the underlying second layer of silicon nitride. A second anisotropic etching process etches the second layer of silicon nitride to form the second layer of silicon nitride 142c. The second anisotropic etching process is selective to the underlying first layer of silicon dioxide. A third anisotropic etching process etches the first layer of silicon dioxide to form the first layer of silicon dioxide 142b. The third anisotropic etching process is selective to the underlying first layer of silicon nitride. A fourth anisotropic etching process etches the first layer of silicon nitride to form the first layer of silicon nitride 142a. The fourth anisotropic etching process is selective to the underlying SiCN layer 112.

As presented in the above detailed description, a structure and method is presented to improve the reliability of a bond pad structure, particularly by strengthening the sidewalls 118 with a layer of SiCN material 112 and protective structures 124. The protective structures 124, which may be a single material or a laminate, prevent mechanical damage from wire bonding process in the sidewalls 118 of the opening, specifically, cracking at the interface 168 between the bond pad 106 and the passivation layer 110.

The terms "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in one embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

While several exemplary embodiments have been presented in the above detailed description of the device, it should be appreciated that number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A bond pad structure comprising:
    a dielectric layer;
    at least one bond pad in the dielectric layer, having a bond pad top surface;
    a passivation layer having an interface with a first portion of the bond pad top surface;
    an opening in the passivation layer over the bond pad, wherein the opening has sidewalls;
    a low-k barrier layer covering the sidewalls of the opening and a second portion of the bond pad top surface; and
    protective structures over the low-k barrier layer at the sidewalls of the opening.

2. The bond pad structure of claim 1, wherein the protective structures are over an end of the interface adjacent to the second portion of the bond pad top surface.

3. The bond pad structure of claim 1, wherein the protective structures have a thickness in a range of 2000 to 5000 Å.

4. The bond pad structure of claim 1, wherein the low-k barrier layer comprises SiCN, SiON or $Si_xN_y$.

5. The bond pad structure of claim 1, wherein the low-k barrier layer has a thickness in a range of 50 Å to 125 Å.

6. The bond pad structure of claim 1 further comprising a wire bonded to the bond pad, wherein the wire is made of copper.

7. A bond pad structure comprising:
    a dielectric layer;
    at least one copper bond pad in the dielectric layer, having a bond pad top surface;
    a passivation layer having an interface with a first portion of the bond pad top surface;
    an opening in the passivation layer over the bond pad, wherein the opening has sidewalls;
    a low-k barrier layer covering the sidewalls of the opening and a second portion of the bond pad top surface; and
    protective laminate structures over the low-k barrier layer at the sidewalls of the opening and over an end of the interface adjacent to the second portion of the bond pad top surface.

8. The bond pad structure of claim 7, wherein the laminates comprise:
    a silicon dioxide layer; and
    a silicon nitride layer over the silicon dioxide layer.

9. The bond pad structure of claim 8, wherein the laminates further comprise:
    a second silicon dioxide layer over the silicon nitride layer; and
    a second silicon nitride layer over the second silicon dioxide layer.

10. The bond pad structure of claim 7, wherein the laminates comprise:
    a silicon nitride layer;
    a silicon dioxide layer over the silicon nitride layer;
    a second silicon nitride layer over the silicon dioxide layer; and
    a second silicon dioxide layer over the second silicon nitride layer.

11. The bond pad structure of claim 7, wherein the passivation layer comprises a SiCN layer and an oxide layer over the SiCN layer.

12. A method of fabricating a bond pad structure, the method comprising:
    providing a dielectric layer;
    forming at least one copper bond pad in the dielectric layer, having a bond pad top surface;
    depositing a passivation layer over the bond pad and over the dielectric layer;
    forming an opening in the passivation layer to expose the bond pad, wherein the opening has sidewalls and the passivation layer has an interface with a first portion of the bond pad top surface;
    depositing a low-k barrier layer at the sidewalls of the opening and over a second portion of the bond pad top surface;
    depositing a protective layer over the low-k barrier layer at the sidewalls of the opening and over the second portion of the bond pad top surface; and
    forming protective structures over the low-k barrier layer at the sidewalls of the opening.

13. The method of claim 12, wherein the deposition of the protective layer comprises depositing a silicon dioxide layer.

14. The method of claim 12, wherein the deposition of the protective layer comprises:
    depositing a silicon dioxide layer; and
    depositing a silicon nitride layer over the silicon dioxide layer.

15. The method of claim 14, wherein the deposition of the protective layer further comprises:
    depositing a second silicon dioxide layer over the silicon nitride layer; and
    depositing a second silicon nitride layer over the second silicon dioxide layer.

16. The method of claim 12, wherein the deposition of the protective layer comprises:
    depositing a silicon nitride layer;
    depositing a silicon dioxide layer over the silicon nitride layer;
    depositing a second silicon nitride layer; and
    depositing a second silicon dioxide layer over the second silicon nitride layer.

17. The method of claim 12, wherein the protective layer is deposited by chemical vapor deposition.

18. The method of claim 14, wherein the formation of the protective structures comprises:
   etching the silicon nitride layer; and
   etching the silicon dioxide layer to form protective structures.

19. The method of claim 12, wherein the protective structures are formed by reactive ion etching.

20. The method of claim 12 further comprising bonding a copper wire to the copper bond pad.

\* \* \* \* \*